United States Patent
Vo

(10) Patent No.: US 7,570,504 B2
(45) Date of Patent: Aug. 4, 2009

(54) DEVICE AND METHOD TO REDUCE WORDLINE RC TIME CONSTANT IN SEMICONDUCTOR MEMORY DEVICES

(75) Inventor: Huy Thanh Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 667 days.

(21) Appl. No.: 09/808,750

(22) Filed: Mar. 15, 2001

(65) Prior Publication Data

US 2002/0131290 A1    Sep. 19, 2002

(51) Int. Cl.
  *G11C 5/06* (2006.01)
  *G11C 5/02* (2006.01)
  *G11C 8/00* (2006.01)
(52) U.S. Cl. .................. 365/63; 365/51; 365/230.06
(58) Field of Classification Search ............... 365/51, 365/63, 230.06, 149, 230.03; 257/324, 412, 257/57, 66, 296, 301, 758; 438/241, 242, 438/243, 244
  See application file for complete search history.

(56) References Cited

U.S. PATENT DOCUMENTS

| | | | |
|---|---|---|---|
| 5,687,117 A | 11/1997 | Chevallier et al. | |
| 5,708,621 A * | 1/1998 | Tanoi | 365/230.06 |
| 5,717,645 A | 2/1998 | Kengeri et al. | |
| 5,768,174 A * | 6/1998 | Seo et al. | 365/63 |
| 5,841,688 A * | 11/1998 | Sukegawa et al. | 365/63 |
| 5,926,730 A | 7/1999 | Hu et al. | 438/592 |
| 5,933,387 A * | 8/1999 | Worley | 365/230.03 |
| 5,940,315 A * | 8/1999 | Cowles | 365/51 |
| 6,015,997 A | 1/2000 | Hu et al. | 254/412 |
| 6,057,573 A * | 5/2000 | Kirsch et al. | 257/296 |
| 6,060,350 A * | 5/2000 | Iwasa | 438/239 |
| 6,240,046 B1 | 5/2001 | Proebsting | |
| 6,266,264 B1 * | 7/2001 | Proebsting | 365/63 |
| 6,760,267 B2 | 7/2004 | Chevallier et al. | |
| 7,193,266 B2 | 3/2007 | Roohparvar | |
| 2005/0202622 A1 | 9/2005 | Violette et al. | |

* cited by examiner

*Primary Examiner*—Son L Mai
(74) *Attorney, Agent, or Firm*—Schwegman, Lundberg & Woessner, P.A.

(57) ABSTRACT

A semiconductor memory device and a method of making and using a semiconductor memory device containing a word line design, which is used in ultra-large scale integrated (ULSI) circuits, that produces a device with a lower RC time constant than devices formed using prior art techniques. In one embodiment of the invention low resistivity metal strapping layers are attached to alternating halves of wordlines in a single memory array. The alternating pattern allows the low resistivity of the strapping layers to be utilized without introducing significant negative capacitive resistance effects due to strapping layers being too close to each other.

3 Claims, 6 Drawing Sheets

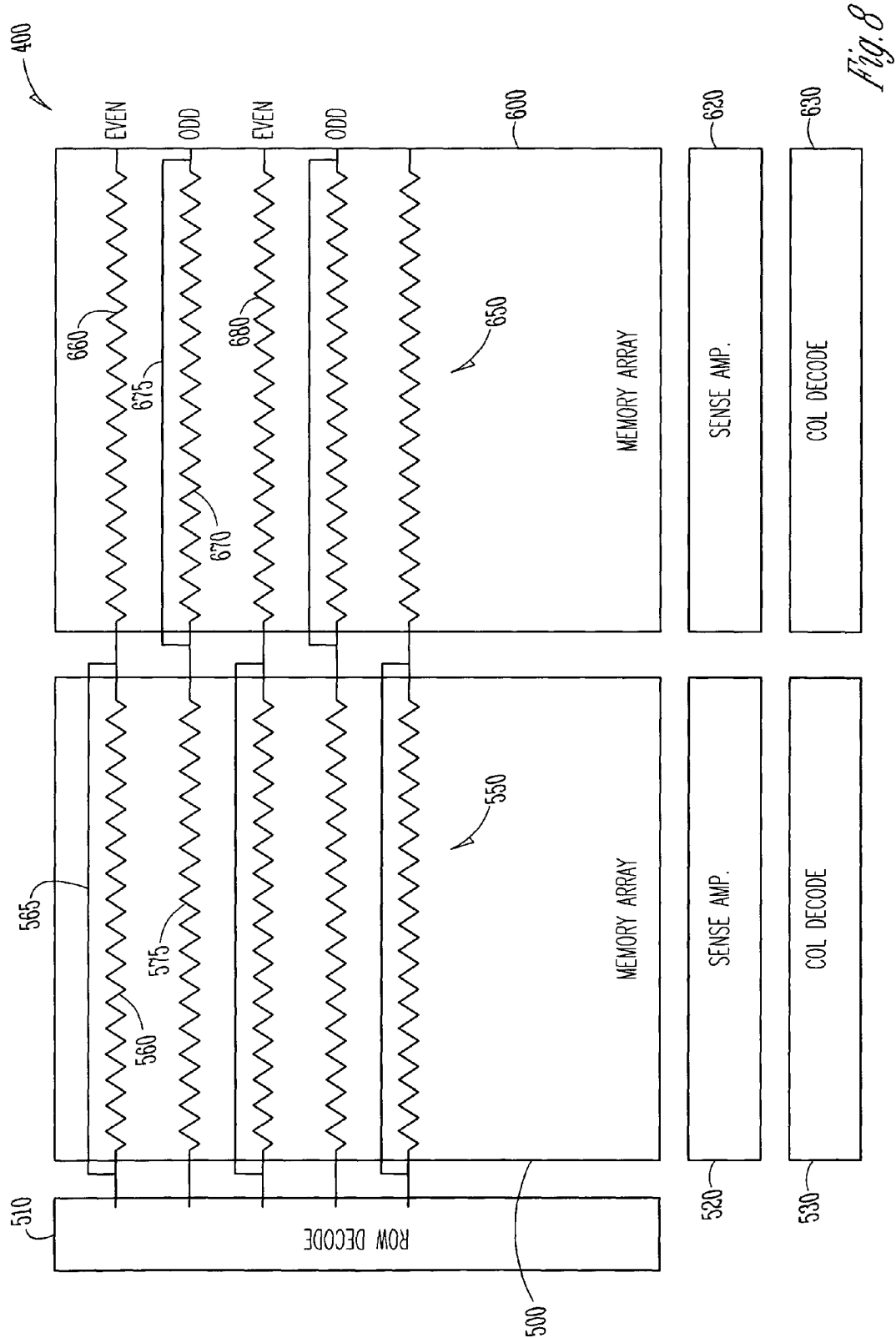

and method to reduce wordline rc time constant in semiconductor memory devices

TECHNICAL FIELD OF THE INVENTION

This invention relates to the manufacture of semiconductor memory devices. Specifically, this invention relates to wordline devices used in accessing memory cells in a semiconductor memory array.

BACKGROUND OF THE INVENTION

Semiconductor memory devices are comprised of at least one array of memory cells. Each memory cell is comprised of a capacitor, on which the charge stored represents the logical state of the memory cell. A positive charged capacitor corresponds to a logical state of "1" and a negative capacitor corresponds to a logical state of "0." Word lines activate access transistors, so that the logical state of a memory cell can be read. Gates of multiple transistors are formed as one word line.

An example of a word line's application is in a dynamic random access memory (DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer.

The performance of the DRAM, and the small device sizes that are achievable are largely dependent on the resistance of the DRAM circuitry. There are inherent resistances in the conducting materials chosen for the circuits, and there are resistances due to the configuration of the circuits. Even though a low resistance metal may be chosen for a conductor, the size of the cross section of a conductor affects its resistivity, and neighboring structures may create a capacitance that causes additional resistance in the conductor. The combination of these effects in a circuit can be measured by a constant called a resistance-capacitance (RC) time constant. A lower resistance in the circuit leads to a lower value of the RC time constant, and a faster performing memory device.

The RC time constant is especially affected by wordline design due to the extended length of word lines, and their necessarily small size as they are integrated into access transistors. In ultra large scale integrated (ULSI) circuits, a highly conductive word line is necessary to improve circuit density and performance. It therefore follows, that the problem of wordline RC losses must be overcome. As devices are scaled down in size, word line widths are also decreased. Both the smaller cross section of wordlines, and the increased length of wordlines in ULSI circuits contribute to increased resistance. To date, word line resistance is one of the primary limitations of achieving faster ULSI circuits. A method for decreasing the resistivity of word lines is needed for use in ULSI applications.

Wordlines are frequently made of polysilicon, however polysilicon has a relatively high resistivity compared to other metal materials. One approach to lowering wordline resistivity has been to add a second layer of lower resistivity metal on top of a polysilicon wordline to make a two layer wordline. The aim of this approach is to lower the resistivity of the entire wordline, and as a result to accommodate the large number of memory cells that a wordline must access in a ULSI circuit. A significant problem with this approach has been the compatibility of the polysilicon with the second metal layer. They tend to diffuse into each other, and the low resistivity of the metal layer is drastically compromised.

What is needed is a DRAM wordline design that lowers the RC time constant of the circuit without the diffusion problems associated with multiple metal layers in wordline design.

SUMMARY OF THE INVENTION

A semiconductor memory device containing a word line design, which is used in ultra-large scale integrated (ULSI) circuits, that produces a device with a lower RC time constant than devices formed using prior art techniques. In one embodiment of the invention low resistivity metal strapping layers are attached to alternating halves of wordlines in a single memory array. The alternating pattern allows the low resistivity of the strapping layers to be utilized without introducing significant negative capacitive resistance effects due to strapping layers being too close to each other. Each wordline obtains some benefit of having a portion of its length strapped with low resistivity metal.

The invention may contain strapping layers that strap various portions of a single wordline, with the strapping layers beginning and ending at various locations on the wordline. The arrangement of the strapping layers is such that a strapping layer pitch is sufficiently wide to gain the benefit of low resistivity material without adding significant capacitive resistance losses.

The invention may also contain additional memory arrays coupled to a single row decoder. The RC time constant is reduced by adding strapping layers to alternating wordlines in each array such that in one array, even wordlines are strapped, and in an adjacent array odd wordlines are strapped. The multiple array memory device may contain any arrangement of strapping layers where a strapping layer pitch is sufficiently wide to gain the benefit of low resistivity material without adding significant capacitive resistance losses.

BRIEF DESCRIPTION OF THE DRAWINGS

FIG. 8 is a schematic view of a multiple array solid state memory device according to the teachings of the present invention.

DETAILED DESCRIPTION OF THE EMBODIMENTS

Figure 1:
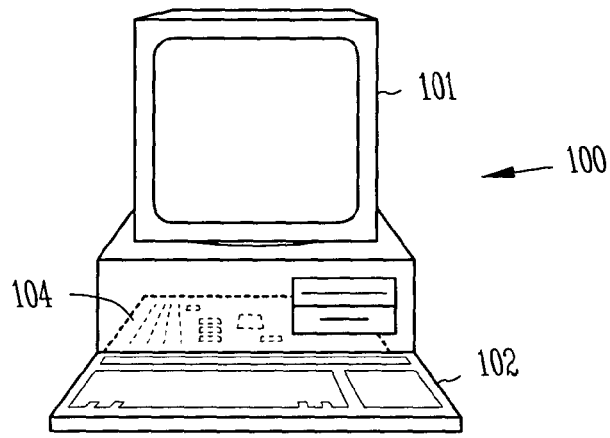
FIG. 1 is a perspective view of a conventional desktop personal computer.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
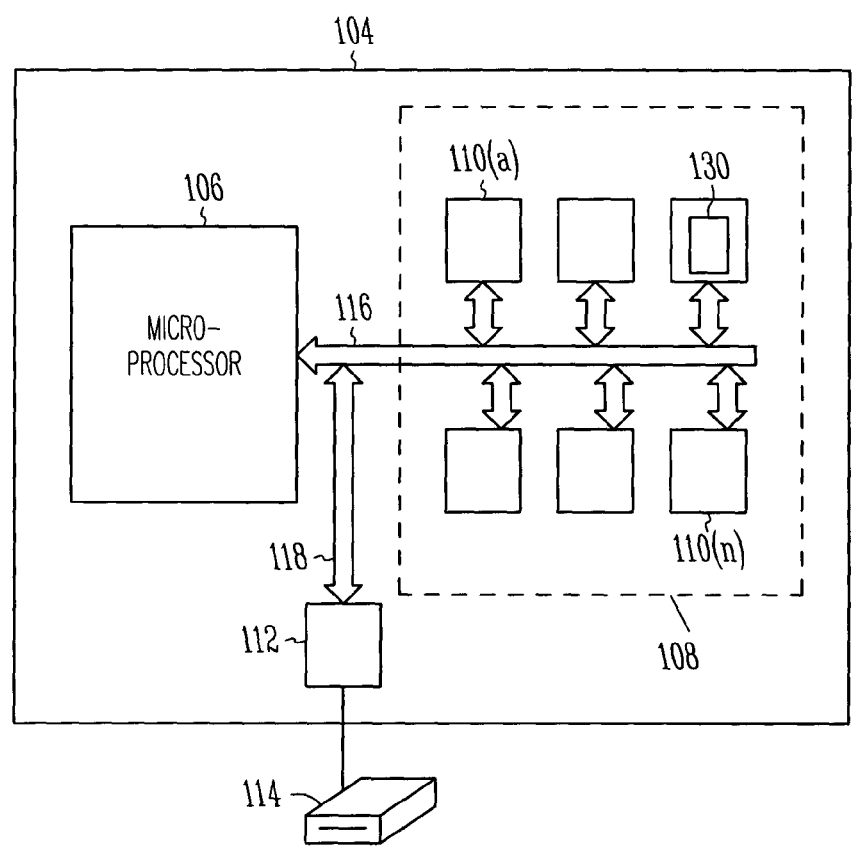
FIG. 2 is a schematic representation of the circuitry of a conventional personal computer.

A personal computer 100 is illustrated in FIGS. 1 and 2, and includes a monitor 101, a keyboard input 102, and a central processing unit 104. The processing unit 104 typically includes a microprocessor 106, a memory bus circuit 108 having a plurality of memory slots 110(a-n), and other peripheral circuitry 112. Peripheral circuitry 112 permits various peripheral devices 114 to interface the processor-memory bus 116 over the input/output (I/O) bus 118. The microprocessor 106 produces control and address signals to control the exchange of data between the memory bus circuit 108 and the microprocessor 106, and between the memory bus circuit 108 and the peripheral circuitry 112. This exchange of data is accomplished over the high speed memory bus 116 and over the high speed I/O bus 118.

A plurality of memory slots 110(a-n) are coupled to the memory bus 116 for receiving memory devices 130 well known to those skilled in the art. Memory devices include, but are not limited to the following types: static random access memory (SRAM), dynamic random access memory (DRAM), synchronous dynamic random access memory (SDRAM), erasable programmable read-only memory (EPROM), electrically erasable programmable read-only memory (EEPROM), or Flash memories. A memory device 130 is illustrated in FIG. 2 in one of the memory slots 110(a-n). A memory device 130 may be packaged as a single in-line memory module (SIMM) or a dual in-line memory module (DIMM), or any other packaging schemes well known in the art.

Furthermore, these memory devices 130 can be produced in a variety of designs which provide different methods of reading from and writing to a memory cell of a memory device 130. For example, a preferred method of reading and writing to a dynamic random access memory (DRAM) device is a page mode operation. Page mode operations in a DRAM access a row of a memory cell arrays and randomly access different columns of the array. Data stored at the row and column intersection can be read and output while that column is accessed.

Figure 3:
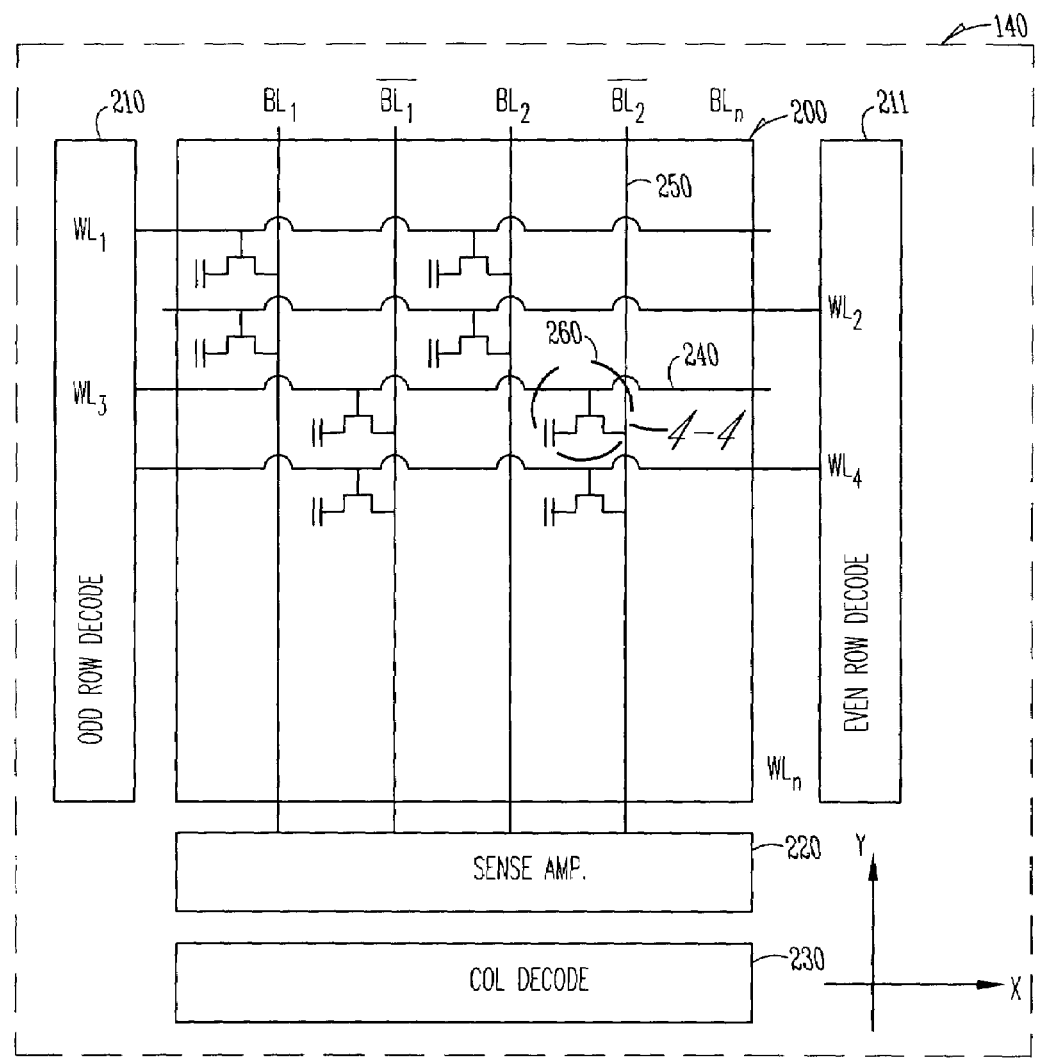
FIG. 3 is a schematic representation of a conventional single array solid state memory device according to the teachings of the prior art.

A specific type of memory device 130 is shown as a DRAM memory device 140, as illustrated schematically in FIG. 3. For ease of illustration, only elements of the DRAM 140 that are necessary for the explanation of the invention are shown. The DRAM 140 is comprised of a memory array 200, containing rows and columns of memory cells 260. The DRAM is fabricated on a semiconductor substrate. Rows run in the X-axis and are called wordlines ($WL_1$-$WL_n$). Columns run in the Y-axis and are called bitlines ($BL_1$-$BL_n$). At each intersection of wordlines and bitlines is a memory cell 260. The X-Y coordinate of each cell serves as an address, and memory cells can be written to, or read from individually based on their address.

Figure 4:
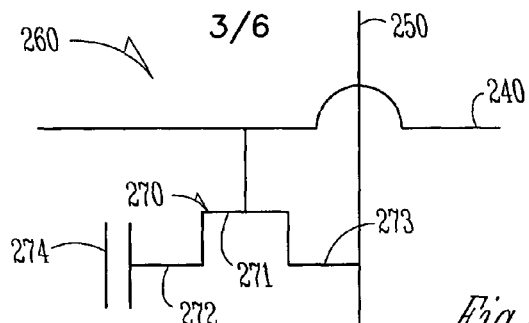
FIG. 4 is a close up schematic view of a single memory cell from FIG. 3 according to the teachings of the prior art.

As shown in FIG. 4, each individual memory cell 260 contains a capacitor 274 for storing the state of the memory cell, and an access transistor 270. The access transistor contains a source region 272 connected to the capacitor 274, a drain region 273 connected to the bitline 250 and a gate region 271 connected to the wordline 240. When a selected wordline 240 is activated, the gate 271 is "opened," and the state of the capacitor 274 can be passed from the source region 272 through the gate 271, and out the drain region 273 to a bitline 250 that has been activated to accept the signal.

In operation, a DRAM memory 140 receives an address of a particular memory cell. A row decoder 210 is used by the microprocessor to activate a selected wordline 240. Once the selected wordline 240 is activated, the state of a selected memory cell 260 along the length of the wordline may be read by activating a corresponding selected bitline 250. The signal from the memory cell 260 is amplified by a sense amplifier 220 and the cell information is then routed to the microprocessor for use.

Figure 5:
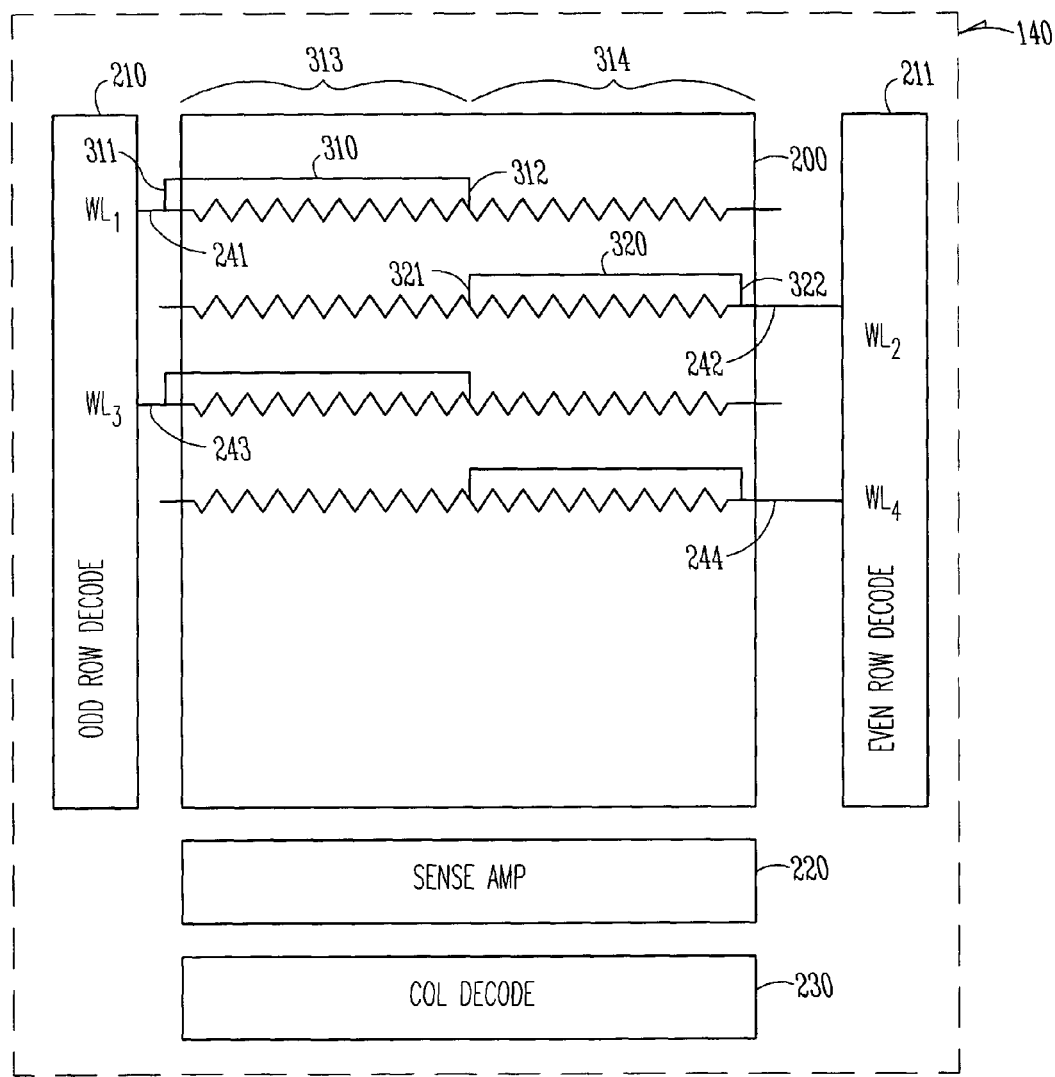
FIG. 5 is a schematic representation of a single array solid state memory device according to the present invention.

FIG. 5 shows a schematic representation of a first embodiment of a DRAM 140 with additional circuitry according to the teachings of the present invention to reduce the RC time constant of the circuit, and as a result, increase the speed of accessing memory cells 260 in the memory array 200. The memory array 200 contains an array of parallel wordlines 300. The array of parallel wordlines 300 contains representative wordlines 241, 242, 243, and 244 for illustration. "Even" wordlines are labeled 242 and 244, while "odd" wordlines are labeled 241, and 243.

A reduced RC time constant is achieved by adding an odd strapping layer 310 over odd wordlines and an even strapping layer 320 over even wordlines. The odd strapping layer 310 is electrically connected to the odd wordlines by a first odd channel 311 and a second odd channel 312. Likewise, the even strapping layer 320 is electrically connected to the even wordlines by a first even channel 321 and a second even channel 322.

A wordline has an inherent resistance from both the polysilicon material the wordline is fabricated from, and the capacitive resistance from its structure as a gate in its associated access transistors. The odd and even strapping layers 310, 320 are made of a material with a resistance that is lower than the resistance inherent in the wordline each is attached to. Preferably, the strapping layer material is a metal. One metal that may be used is aluminum. Another possibility would be refractory metals such as titanium, tungsten, and molybdenum. In one embodiment, the resistance of the metal is on the order of 200 times lower than the resistance of the associated wordline. The channels should likewise have a low resistivity, but the resistivity of the channels is not as important as the strapping layer due to the much shorter length of the channels relative to the length of the strapping layers.

In operation, when a signal is sent from the row decoder 210 to activate the odd wordline 241, the signal directly activates a first portion 313 of the odd wordline 241. The signal also travels through the first odd channel 311, through the odd strapping layer 310, and back to the odd wordline 241 through the second odd channel 312, bypassing the first portion 313 of the odd wordline 241. Because the odd strapping layer has a lower resistivity than the odd wordline 241, the signal reaches a second portion 314 of the odd wordline 241 faster than without the bypassing strapping layer 310.

Likewise, when a signal is sent from the row decoder 211 to activate the even wordline 242, the signal directly activates a first portion 314 of the even wordline 242. The signal also travels through the first even channel 322, through the even strapping layer 320, and back to the even wordline 242 through the second even channel 321, bypassing the first portion 314 of the even wordline 242. Because the even strapping layer has a lower resistivity than the even wordline 242, the signal reaches a second portion 313 of the even wordline 242 faster than without the bypassing strapping layer 320. In one embodiment, the first and second portions 313 and 314 of the wordlines represent a first half and a second half of the wordlines respectively. With this configuration, the RC time constant can be reduced to as low as ¼ the value of the circuit without the strapping layers 310 ans 320.

Figure 6:
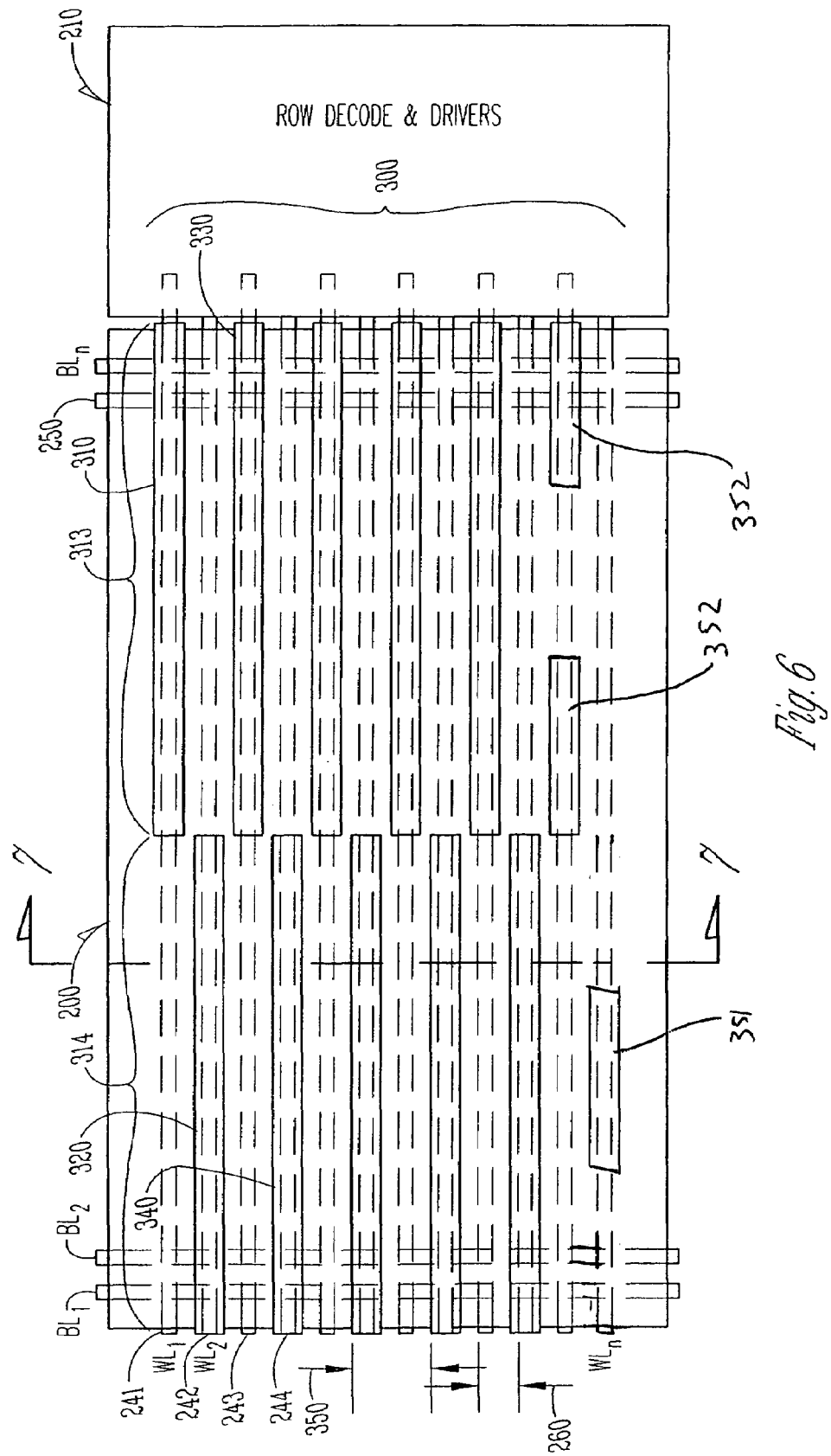
FIG. 6 is a top view of a solid state memory device according to the present invention.
Figure 7:
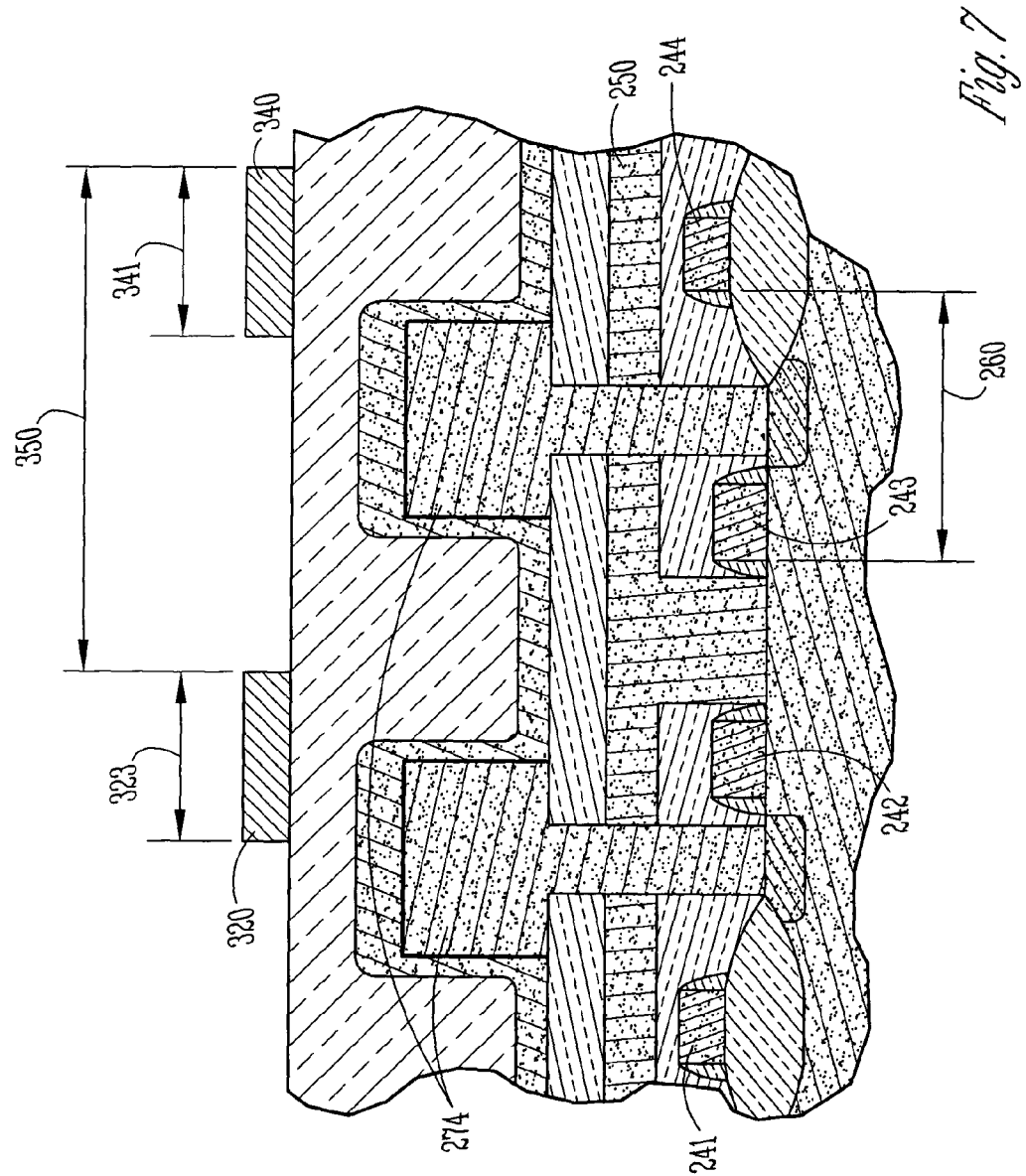
FIG. 7 is a sectional view of the solid state memory device from FIG. 6, cut along line 7-7 according to the teachings of the present invention.

FIGS. 6 and 7 show a physical representation of selected components of the DRAM device 140 that were represented schematically in FIG. 5. The memory array 200 is shown in a top view in FIG. 6 with the array of parallel wordlines 300. FIG. 7 shows even wordlines 242 and 244, and odd wordlines 241 and 243 buried in the structure of the memory array 200. Each wordline is separated from adjacent wordlines by a lateral wordline pitch 260. Memory capacitors 274 are also shown. Two strapping layers 320 and 340 are shown over the top of the circuitry, the strapping layers being separated from adjacent strapping layers by a lateral strapping layer pitch 350. Due to capacitive resistance of adjacent conductors, the strapping layer pitch 350 must be a certain width that tends to be wider than the wordline pitch 260. If all portions of adjacent wordlines were strapped, the strapping layer pitch 350 would be equal to the wordline pitch 260, and resulting capacitive effects between adjacent strapping layers would significantly reduce the benefits to the RC time constant. Also, the strapping layer pitch chosen is influenced by the width of strapping layers 323 and 341. A wider strapping layer gives better conductivity, and strapping only non-adjacent wordlines allows for a wider strapping layer.

As shown in FIGS. 6 and 7, no portions of adjacent wordlines are strapped. A convenient approach to strapping that maintains an acceptable strapping layer pitch 350 that is greater than the wordline pitch 260 is to only strap adjacent portions of every other wordline. In one embodiment, a first wordline portion 313 is strapped on every other adjacent wordline, and a second wordline portion 314 is strapped on wordlines where the first wordline portions 313 were not strapped. This is shown in FIG. 6, where odd wordlines 241 and 243 are strapped on their first wordline portions 313 as indicated by strapping layers 310 and 330. Even wordlines 242 and 244 are strapped on their second wordline portions 314 as indicated by strapping layers 320 and 340.

In this embodiment, the first wordline portion 313 is equal to the first half of the wordline, and the second wordline portion 314 is equal to the second half of the wordline. The strapping layers in this embodiment start at alternating ends of the memory array 200 and end in the middle of the memory array 200. This configuration reduces the RC time constant without increasing the size of the memory array 200. It should be noted, however, that in alternate embodiments the bypassed portions of wordlines could be shorter or longer than half of the wordline length, and the strapping layers may bypass middle portions 351 of the wordline instead of beginning or ending at the far ends of the wordlines. While only one strapping layer is used on each wordline in this embodiment, it should also be noted that multiple strapping layers could be used to bypass multiple portions 352 of each wordline. Multiple channels could also be used with one strapping layer to connect the strapping layer to the wordline.

In another embodiment, shown in FIG. 8, multiple memory arrays in a DRAM device 400 are connected to one row decoder 510. FIG. 8 illustrates a first memory array 500 and a second memory array 600, both arrays being connected to row decoder 510. The first memory array 500 contains an array of parallel wordlines 550 and the second memory array 600 contains an array of parallel wordlines 650. In this embodiment, there are even wordlines and odd wordlines for illustration that are parallel, and across from each other in the arrangement on the DRAM device 400. Even wordlines from the first array of parallel wordlines 550 are electrically connected to corresponding even wordlines in the second array of parallel wordlines 650, and odd wordlines are similarly connected. For example, even wordline 560 in the first array of parallel wordlines 550 is electrically connected to even wordline 660 in the second array of parallel wordlines 650.

A reduced RC time constant is achieved in this embodiment by adding an even strapping layer 565, bypassing even wordline 560 in the first array of parallel wordlines 550. Likewise, an odd strapping layer 675 is added, bypassing odd wordline 670 in the second array of parallel wordlines 650. In the first array of parallel wordlines 550, only even wordlines are strapped, and in the second array of parallel wordlines 650, only odd wordlines are strapped. This configuration maintains the necessary strapping layer pitch 350 discussed above to avoid negative RC time constant effects. This configuration also allows reduction of the RC time constant without increasing the size of the first and second memory arrays 500 and 600.

CONCLUSION

Thus an improved semiconductor memory device and a method of making and using a semiconductor memory device is shown. The invention contains a word line design, which is used in ultra-large scale integrated (ULSI) circuits, that produces a device with a lower RC time constant than devices formed using prior art techniques. In one embodiment of the invention low resistivity metal strapping layers are attached to alternating halves of wordlines in a single memory array. The alternating pattern allows the low resistivity of the strapping layers to be utilized without introducing significant negative capacitive resistance effects due to strapping layers being too close to each other.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description.

The scope of the invention includes any other applications in which the above structures and fabrication methods are used. The scope of the invention should be determined with reference to the appended claims, along with the full scope of equivalents to which such claims are entitled.

What is claimed is:

1. A memory device comprising:

a memory array including a number of memory cells;

an even row decoder located on a first side of the memory array;

an odd row decoder located on a second side of the memory array;

a single column decoder connected to the memory array;

a number of parallel wordlines local to the memory array coupled to gate regions of memory cells, including one or more even wordlines coupled to the even row decoder, and one or more odd wordlines coupled to the odd row decoder, the odd wordlines arranged alternately with the even wordlines; and a number of strapping lines having lower resistance than the wordlines and connected to bypass portions of the wordlines within the memory array, wherein a strapping line connected to an odd wordline bypasses only a portion of the odd wordline within the memory array nearer the odd row decoder, wherein a strapping line connected to an even wordline bypasses only a portion of the even wordline within the memory array nearer the even row decoder.

2. The memory device of claim 1, wherein the even row decoder is located directly adjacent the first side and the odd row decoder is located directly adjacent the second side.

3. The memory device of claim 1, wherein a strapping line connected to an odd wordline bypasses only one half of the wordline within the memory array nearer the odd row decoder and a strapping line connected to an even wordline bypasses only one half of the wordline within the memory array nearer the even row decoder.

* * * * *

UNITED STATES PATENT AND TRADEMARK OFFICE
CERTIFICATE OF CORRECTION

PATENT NO. : 7,570,504 B2 Page 1 of 1
APPLICATION NO. : 09/808750
DATED : August 4, 2009
INVENTOR(S) : Huy Thanh Vo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this

Seventh Day of September, 2010

David J. Kappos
*Director of the United States Patent and Trademark Office*